United States Patent
Thiel et al.

(10) Patent No.: US 9,430,230 B2
(45) Date of Patent: Aug. 30, 2016

(54) METHOD FOR AUTOMATED MANAGING OF THE USAGE OF ALTERNATIVE CODE AND A PROCESSING SYSTEM OF OPERATING THEREOF

(71) Applicants: Tobias Thiel, Anzing (DE); Markus Regner, Graefelfing (DE); Michael Rohleder, Unterschleissheim (DE)

(72) Inventors: Tobias Thiel, Anzing (DE); Markus Regner, Graefelfing (DE); Michael Rohleder, Unterschleissheim (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/459,419

(22) Filed: Aug. 14, 2014

(65) Prior Publication Data

US 2016/0048390 A1    Feb. 18, 2016

(51) Int. Cl.
*G06F 9/44* (2006.01)

(52) U.S. Cl.
CPC . *G06F 8/71* (2013.01); *G06F 8/36* (2013.01); *G06F 8/73* (2013.01)

(58) Field of Classification Search
CPC .................................... G06F 8/71; G06F 8/73
USPC ................................................ 717/123, 120
See application file for complete search history.

(56) References Cited

U.S. PATENT DOCUMENTS

| | | | | |
|---|---|---|---|---|
| 5,920,830 A | * | 7/1999 | Hatfield | G01R 31/318307 702/119 |
| 6,591,403 B1 | * | 7/2003 | Bass | G06F 17/5022 716/102 |
| 6,631,508 B1 | * | 10/2003 | Williams | G01R 31/318314 716/121 |
| 7,162,743 B1 | * | 1/2007 | Bolding | G06F 21/71 711/E12.093 |
| 7,346,864 B2 | * | 3/2008 | Srouji | G06F 17/5045 716/102 |
| 7,480,919 B2 | * | 1/2009 | Bray et al. | 719/318 |
| 8,793,661 B1 | * | 7/2014 | Fei et al. | 717/127 |
| 2004/0243534 A1 | * | 12/2004 | Culter | G06F 9/4411 |
| 2005/0216247 A1 | * | 9/2005 | Ikeda | G06F 17/5018 703/19 |
| 2006/0229859 A1 | * | 10/2006 | Srouji | G06F 17/5045 703/14 |
| 2008/0057874 A1 | * | 3/2008 | Shvodian | H04B 17/21 455/67.11 |
| 2013/0080479 A1 | | 3/2013 | Fuchs et al. | |
| 2014/0123113 A1 | * | 5/2014 | Murthy et al. | 717/125 |

FOREIGN PATENT DOCUMENTS

CN           102779258 A       11/2012

* cited by examiner

*Primary Examiner* — Phillip H Nguyen (57) ABSTRACT

The present application relates to a method and a processing system for automated managing of the usage of alternative code. Code sections including original code and alternative code are retrieved from a code basis and the retrieved code is analyzed to detect an alternative code section. A condition definition associated with the identified alternative code section is further retrieved and the condition of the retrieved condition definition is evaluated. The identified alternative code section is activated in accordance with the evaluation result.

20 Claims, 6 Drawing Sheets

METHOD FOR AUTOMATED MANAGING OF THE USAGE OF ALTERNATIVE CODE AND A PROCESSING SYSTEM OF OPERATING THEREOF

FIELD OF THE INVENTION

The present invention generally relates to a device and a method for revisioning of hardware related code. In particular, the present invention relates the field of computer-aided design system of hardware using hardware description languages for defining the behavioral and structural design of electric circuits. Further, the present invention relates to hardware describing abstraction code applicable for synthesis of circuits modeled at register-transfer level (RTL) and code specifically generated to interoperate with hardware including code embedded in electronic circuits.

BACKGROUND OF THE INVENTION

The design methodology for electronic circuit designs, in particular complex integrated circuit (IC) designs, has evolved with the advancement in process technologies. Currently, hardware description languages (HDL) are widely used to describe the behavioral and structural design of an electronic circuit at different levels of abstraction. HDL languages are for example Verilog (IEEE-STD1364), SystemVerilog (IEEE-STD1800) or VHDL (Very high speed integrated circuit Hardware Description Language defined by IEEE-STD1076) to describe the circuit at register-transfer level (RTL). A computer-aided design (CAD) tool, generally also called logic synthesizer, is then used to transform the above behavioral and structural description in a HDL into a technology dependent gate-level netlist, taking into account user-specified constraints on timing, power, area, etc.

The design of electronic circuits needs to be verified in order to prove for their proper functionality. With the ever-growing complexity of circuits, the verification cost has become a significant portion of the total development cost. Hence, verification issues should be taken seriously in the design process. Simulation environments are used to verify the abstracted designs using simulation models to represent circuits that interface to the designs. Such collection of simulation models is commonly called a testbench environment.

SUMMARY OF THE INVENTION

The invention provides a method and code selector device for automated alternative code management as defined in the independent claims.

Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In particular, aspects and advantages can be seen on review of the drawings, the detailed description and the claims, which follow.

DETAILS DESCRIPTION OF THE PREFERRED EMBODIMENTS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

It is understood that the following disclosure provides many different embodiments, or examples, capable of implementing different features. Specific examples of components and arrangements are described below to simplify and thus clarify the present disclosure. These are, of course, merely examples and are not intended to be limiting. In many instances, the features of one embodiment may be combined with the features of other embodiments. In addition, the present disclosure may repeat reference numerals and/or letters in the various exemplary embodiments. This repetition is for the purpose of simplicity and clarity and does not itself dictate a relationship between the various embodiments and/or configurations discussed.

The design of electronic circuits involves a multiplicity of instances, which will be briefly outlined in the following for the sake of understanding. At first, a system specification has to be defined and an architectural design decision has to be met. After that the functional design and logic design is developed. The functional design and logic design is defined at different levels of abstraction, which in particular addresses the needs to handle the increasing complexity of electronic circuits. The functional design and logic design is the major design stage at which the functionality of the electronic circuits is specified. Accordingly, verification of the functional design and logical design is an imminent requirement. Such verification should cover all foreseeable operational states but also unforeseeable operational states for instance due to invalid signals or state/signal interdependencies. Any imperfect functional design and logic design may not be rectified later any more at a manufactured electronic circuit. In a following stage, the physical design is determined on the basis of the functional and logic design. The conversion or transformation of the logic design and functional design into the physical design is also designated as synthesis. The physical design may be understood as an instantiation of the electric and electronic components and the geometrical arrangement thereof in accordance with the specified functional design and logical design. The physical design may include several iterations and also, if necessary for instance due to specification constraints such as die area, power consumption etc., a revising of the functional design and/or logic design. Further, the physical design may be subjected to verification before finally a tapeout of the electronic circuits is made. "Tapeout" is conventionally understood to refer to the point in time where the logic and functional design of the electronic circuit is completed and the design information is sent to begin the preparation of mask(s). Masks may be considered as a template that is used in the semiconductor manufacturing process for producing the physical electronic circuit under development. The origin of the term "tape out" leads back to past times, where the design information was provided on paper with adhesive tape thereon, later magnetic tape reels were loaded with the final electronic files used to create the photo mask at the factory.

As aforementioned, the functionality of an electronic circuit is specified at the stage of the functional design and logic design. The need and desire to allow for specifying complex functional design and logic design have driven the development of hardware description languages, which enable to specify the functionality of an electronic circuit on the basis of logic definitions on different levels of abstraction thereby allowing for handling complex functionalities. Hardware description languages are abstracting languages, which allow to model hardware processes such as flip-flops, multipliers, adders etc., which are executed in parallel and independently from each other. The abstracted code defined on the basis of any hardware description language is intended to be finally converted/transformed using a logical synthesis into the physical design, which may be understood as a physically realizable model of components and interconnects also referred to as a netlist or gate netlist. The abstracted code allows for behavioral and structural description of the electronic circuits.

Figure 1:
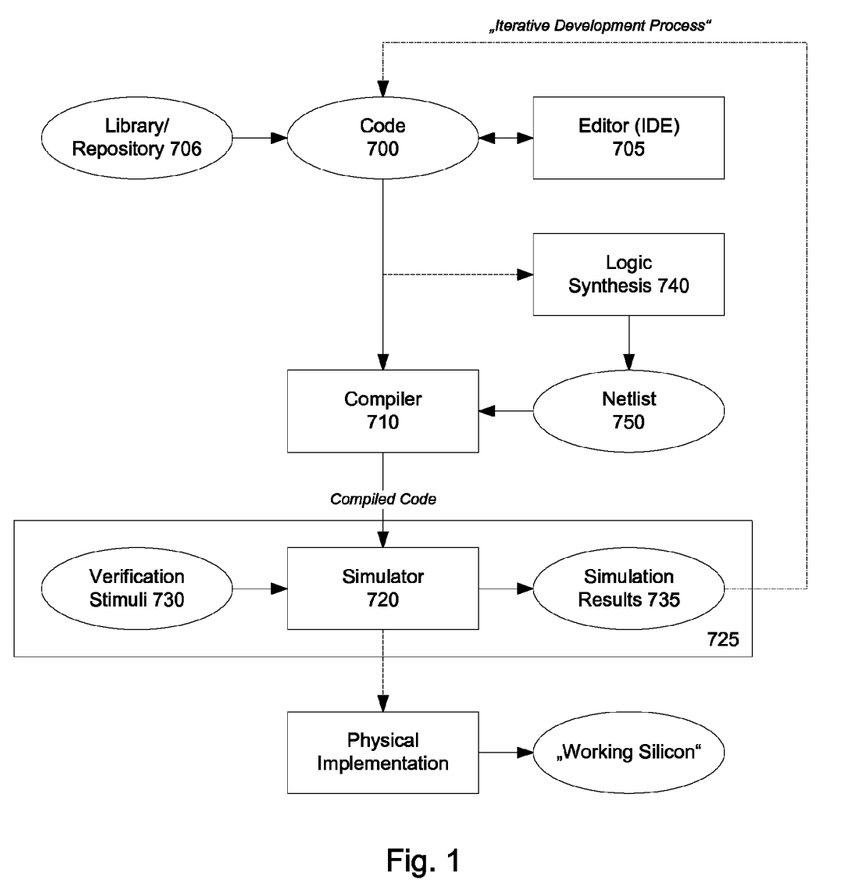
FIG. 1 schematically shows a block diagram illustrating an arrangement of the development stages.

FIG. 1 shows a block diagram illustrating an arrangement of the development stages, in such terms that one skilled in the art to which the invention most nearly pertains could readily implement the methodology.

At a conceptual level, a behavioral description 700 of the target circuit is formulated in a high-level language. The behavioral description, which is represented by the abstracted code, is compiled by a complier 710 and simulated using a simulator 720, to which verification stimuli 730 are inputted and from which simulation results 735 are outputted to verify the design description.

At a structural level, the code or a portion of the code is provided to logic synthesizer 740, which formulates a gate level logic (functional blocks). Additional information regarding the functional blocks may be derived from libraries. The output of the logic synthesizer 740 is a netlist 750 for the target circuit, which is compiled by the complier 710 and simulated by the simulator 720 using the verification stimuli 730. By iteratively repeating this process, both the behavioral and structural descriptions of the target circuit can be fine tuned to meet and/or modify the design criteria.

It should be noted that the code, which is created during the development of a hardware design, does not only relate to the code of hardware abstraction defining the hardware design to be developed but also the so-called testbench, which is part of the simulation/verification environment, in which the code of the hardware design is embedded, and which provides interfaces for the verification stimuli supplied to the simulated code and signals detected during verification/simulation run.

After a valid, verified netlist has been described, the structural description of the target circuit may be provided to a silicon compiler and forthcoming processing to create a working device.

Figure 2:
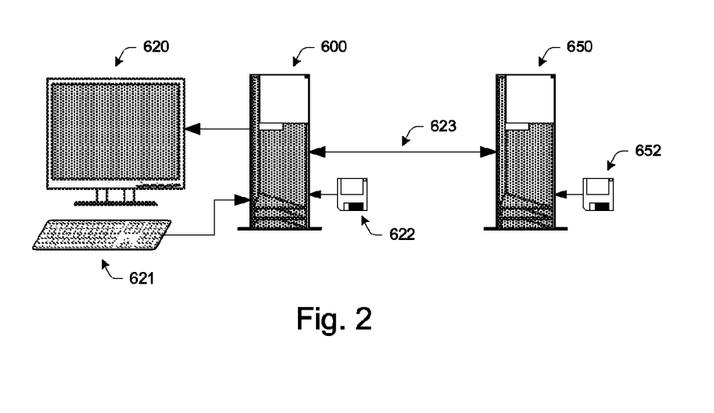
FIG. 2 schematically shows a block diagram of a development environment.

FIG. 2 schematically shows block diagram of an exemplary development system, at which the aforementioned development stages may be performed. Such a development environment may exemplarily comprise a processing system 600 with mass storage devices, a graphical display device 620 and a keyboard/pointing device 621 for user inputs. The exemplary development system may further comprise a simulation accelerator 650 supporting and accelerating the simulation process coupled to the processing system 600 via an I/O interface such as a network connection. The development environment comprises one or more software applications executed on the devices of the system for developing, simulating and verifying the functional and logical design of the target circuits. The software operated on the processing system 600 and the simulation accelerator 650 may be provided on computer readable media 622 and 652.

The code of hardware abstraction defined on the basis of a hardware description language is created in an iterative development process. For instance, code relating to new functionalities may be successively added, issues may be detected and corrected and modifications may be made and/or included in each iterative stage. A verification and/or simulation run on the basis of the revised code may be performed at the iterative stages. In particular, so-called alternative code may be included into the code describing the hardware design to deal with issues occurring during the development phase of the logic design and functional design. Alternative code may for instance be provided and/or included to provide a workaround or an alternative solution for a problem identified during a verification/simulation run, to provide functionality, which has not been coded at a current development stage and included to make the system under development functional for verification/simulation runs, to replace complex code in order to reduce the complexity of a verification/simulation run, to include code, which is intended for test and/or verification purpose and which may be not synthesizable into physically realizable model of components and interconnects (for instance to enable verification/simulation), and to hide code for instance to meet confidentiality requirements.

The above list should be understood as exemplary and not limiting the scope of the present application. Those skilled in the art understand the alternative code may be provided because of further reasons and purposes.

The development process of the hardware design may be managed and supported by a so-called tracking application. Such a tracking application allows for defining the progress of development in particular with regard to functionalities to be implemented at specified stages (e.g. versions, milestones etc.) and tickets indicating issues, which have been identified and have to be solved before tapeout. A tracking application enables the developers of a hardware design to manually track the use of alternative code during the development of the hardware design.

Figure 3:
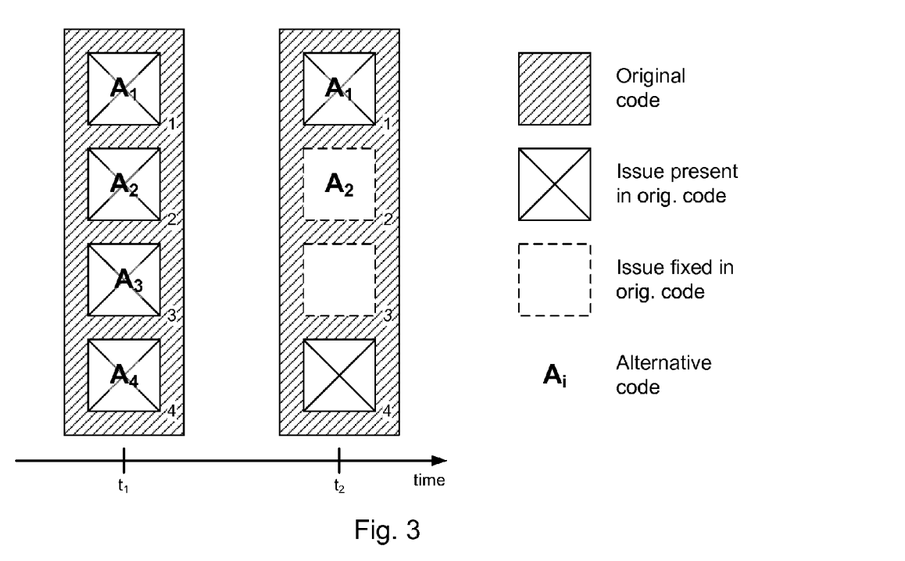
FIG. 3 schematically shows an example of a hardware describing code formed of original code and alternative code sections with respect to a time course.
Figure 4:
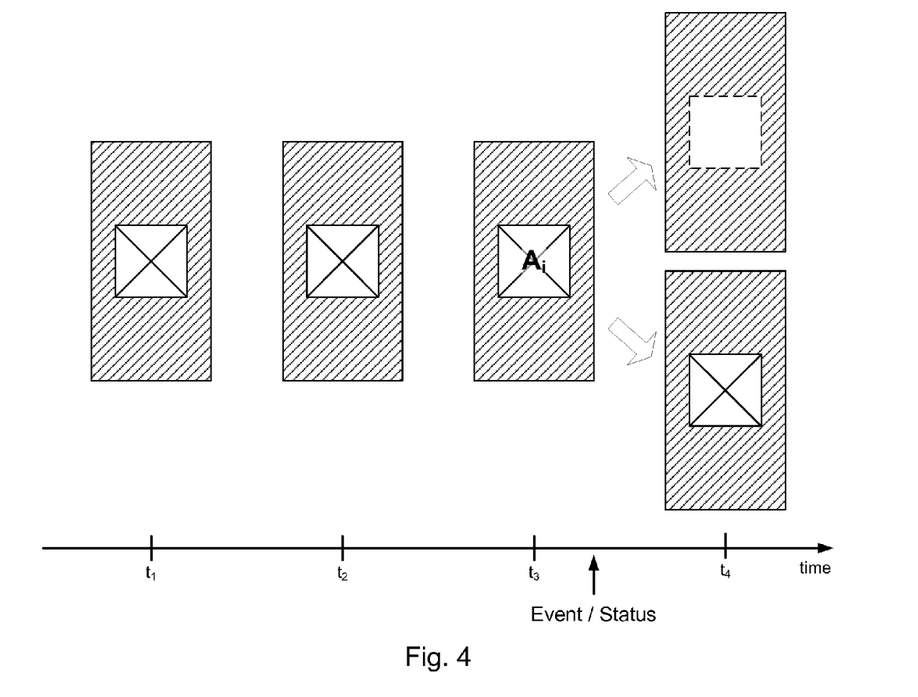
FIG. 4 schematically shows a further example of hardware describing code formed of original code and alternative code sections with respect to a time course.

The above description will be more fully understood when referring to FIGS. 3 and 4 illustrating the use of alternative code during the development phase. In particular, those skilled in the art will understand that a manual handling of alternative code by the developers is to be considered error prone even if supported by tracking tools. As exemplarily illustrated in FIG. 3, at a point in time t1, the development code is composed of original code and several alternative code sections A1 to A4. As aforementioned, code represents an abstraction (on different levels) of the behavioral and/or structural description of a target circuit. Original code should be understood as code comprising code sections considered as acceptable for the final version. In particular, original code may be successfully verified in view of the behavioral requirements to be met, which may in particular include functionality and/or safety requirements, and may be considered to meet the requirements of quality. The development code should be understood as the hardware describing code, which reflects a current development status and stage at a given point in time. The development code comprises original code sections and one or more alternative code sections, which are active or activated. Verification runs, simulation runs and/or further code processing operations are performed on the basis of the development code in order to finally obtain the final version of the original code. Further, it should be understood that the synthesis processes for transforming the abstracted description of the target circuit into the final physical implementation thereof. The final synthesis processes should be performed on the basis of original code only. In the light of above description, original code may be understood to represent development code without active or activated alternative code. The aforementioned code representations may be present only internally to the development environment for the circuit under development. In the example of FIG. 3, the alternative code sections A1 to A4 have been activated and amend the original code to form the development code with workarounds for issues. As aforementioned, the issues may address inter alia functional issues, logical issues, complexity reduction issues, simulation issues, verification issues, testbench adaptation issues etc. The exemplary issues present in the original code and identified therein are enumerated 1 to 4. At a point in time t2, the development code, which is formed of the original code and several alternative code sections, comprises the two activated alternative code sections A1 and A2 and the alternative code sections A3 and A4 are not active any more in the development code.

Assuming now that the point in time t2 is the point in time, at which the final code version for conversion into physical design should be provided for the tapeout, the presence of the alternative code sections, i.e. activated alternative code sections, may be considered as inacceptable in view of safety and quality requirements. In case of issue 1, which should be considered to be still present and not fixed in the original code, the alternative code section A1 may obscure the still existing presence of issue 1 even if a final verification/simulation run is performed. In case of issue 2, which should be to be fixed in the original code, the alternative code section A2 obscures the hardware functionality described by the fixed original code. An alternative code section may replace an original code section or functionally replace or impact the function defined by an original code section. Such situation may also not be detected at a final verification/simulation run. In case of issue 3, the fixed original code instead of the alternative code section A3 is present in the final code version as intended and required. In case of issue 4, the original code instead of the alternative code section A3 is functionally present in the final code version. This situation should be also considered as acceptable because the issue 4 will be detected in a final verification/simulation run in response to which the development phase may be reentered to fix the issue 4.

For the above made considerations and drawn conclusions, it is well understood that the use of alternative code requires special precautions and care. As further exemplary illustrated in FIG. 4, precautions have to be made for preventing the presence of alternative code in the original code and the development code, respectively, at a defined point in time. An automated managing of alternative code as suggested in the present application and described below in greater detail takes events and/or status information into account for the decision whether alternative code or one or more alternative code sections should be activated or not. The terms "not activated" or "expired" used alternatively should be understood in that not activated/expired alternative code (sections) is at least ignored in a synthesis process converting the hardware describing code onto the physical design or not part of the (final) development version of the code used to verify the physical design. In particular, only original code is used for the synthesis process. The term "activated" should be understood therein that the activated alternative code is part of the development code being composed of the original code and at least the activated alternative code. The event and/or status information may comprise information, provided by the simulation environment, simulation models, project managing tools, version revisioning tools, and/or the developer(s). In particular, the event and/or status information may relate to a defined development phase related event/status such as version information, project schedule information, milestone definitions, maturity level information, and/or date/time information. The developer provided information may for instance comprise a decryption key, a password, a magic cookie, and/or a tool switch describing any of the previous or a feature, phase or state. The aforementioned event and/or status information may be understood to be descriptive of the progress of the development of the hardware design. More particularly, the event and/or status information may be retrievable from and/or supplied by one or more systems and/or components of the overall development environment used during the development of the logic design and functional design of the hardware. The event and/or status retriever may comprise interfaces to the information providing systems and/or components of the development environment. The retrieval of event and/or status information may be triggered by the evaluation of a condition definition enabling the provision of required event and/or status information.

The development phase is further illustratively depicted in FIG. 4 with respect to a schematically illustrated tracking tool. Tracking tools are used to document issues detected and/or identified in the original code as well as alternative code sections, which are workarounds for the one or more detected and/or identified issues. The exemplified table illustrates exemplary issues 1, 2 and m, which are detected at the points in time t2 and t3. Alternative code addressing the issues 1 and 2 (identified at point in time t2) is provided at the point in time t3, and an alternative code addressing the issue m (identified at point in time t3) is provided at the point in time t4. The alternative code A1 for the issue 1 is provided and active (activated) at the point in time t3 up to the point in time t5, the alternative code A2 for the issue 2 is provided and active (activated) at the point in time t3 up to the point in time t4, and the alternative code Am for the issue m is provided and active (activated) at the point in time t4 at least up to the point in time t6. Points in time, at which the alternative code sections are considered to be expired, are exemplarily shown in the table of FIG. 3. The issue 1 and m are fixed in the original code at the point in time t5 and the issue 2 is fixed in the original code at the point in time t6. From the forgoing description, the skilled reader understands that the presence of the activated alternative code Am at point in time t6, which alternative code Am originally included for the issue m, which is already fixed in the original code at this point in time, may be regarded as critical. The development code at point in time t6 still comprises original code and active alternative code. Such development code should not form the basis of the final code for tapeout.

From a safety and quality point of view, alternative code should not be part of the code, which is intended for the final code version. The code represents the behavioral description of the logic and functional design of the target circuit. Any alternative code being part of the final code accordingly alters the logic and functional design of the target circuit, which means that in a worst case scenario a device finally manufactured on the basis of such code may include serious defect(s), which cannot be worked around or render the target circuit inoperative. Although the following description will relate to and refers to code representing the logic and functional behavioral description of target hardware design, those skilled in the art will understand that the present invention will be also applicable to code development, which final version may not be altered or amended once the final version has been approved.

The automated managing of the usage of alternative code on the basis of event and/or status information described in the present application takes into account event and/or status information relating to the progress of the development for activating alternative code in that a condition definition associated with each alternative code section is evaluated. The alternative code sections are activated in accordance with the evaluation result. In an example of the present application, the condition to activate alternative code is at least not met when the final version of the hardware describing code (original code) is to be generated for being compiled.

Figure 5:
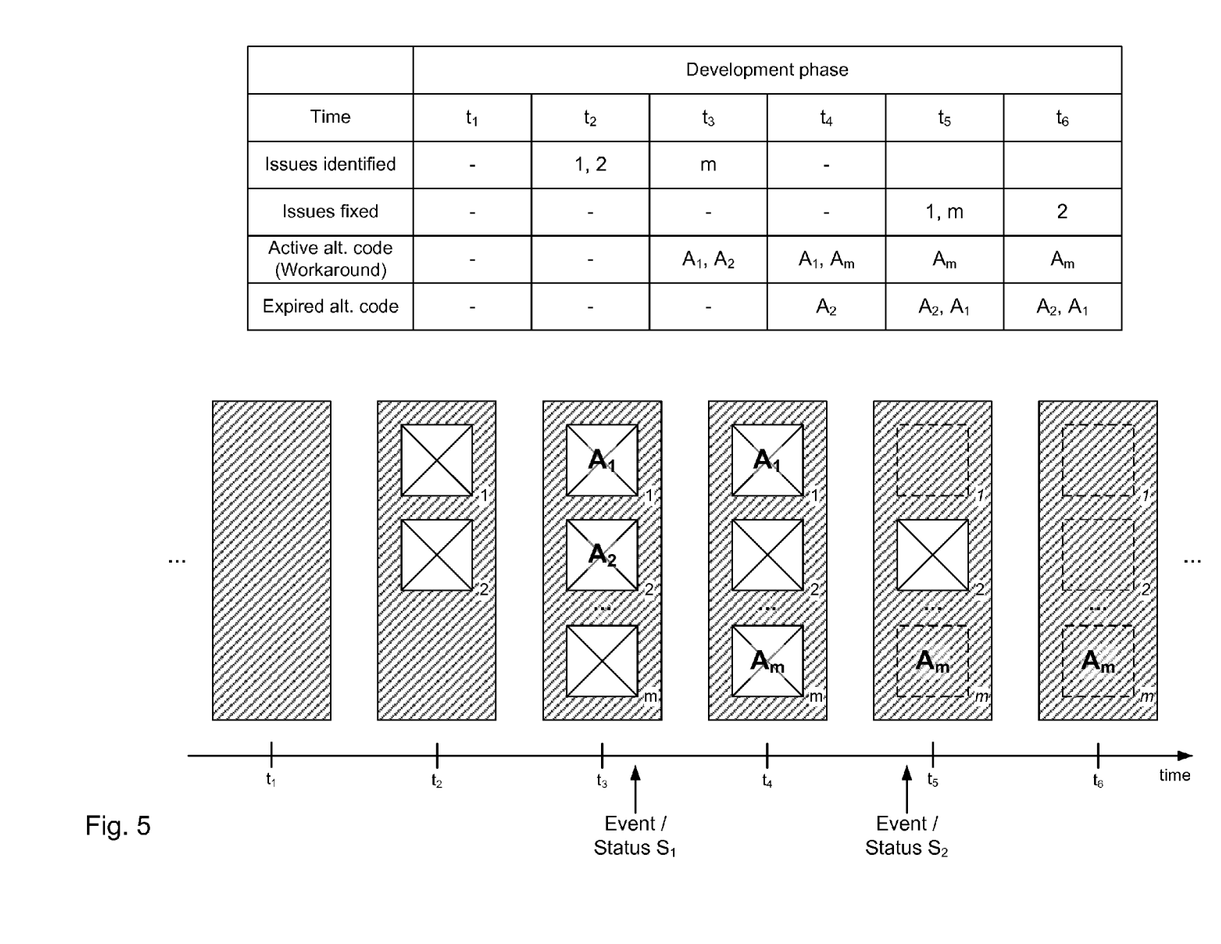
FIG. 5 schematically shows an example of a development of the hardware describing code during the development phase.

As exemplarily illustrated in FIG. 5, an event and/or status information S1 may be available after some point in time between the points in time t3 and t4 and an event and/or status information S2 may be available after some point in time between the points in time t4 and t5. The event and/or status information S1 is applicable as input to a condition test, which result indicates that the alternative code A2 is not to be activated thereafter anymore. Accordingly, the alternative code A2 is not activated at point in time t4 and thereafter. The event and/or status information S2 is applicable as input to a condition test, which result indicates that the alternative code A1 is not to be activated thereafter anymore. Accordingly, the alternative code A1 is not activated at point in time t5 and thereafter.

Figure 6:
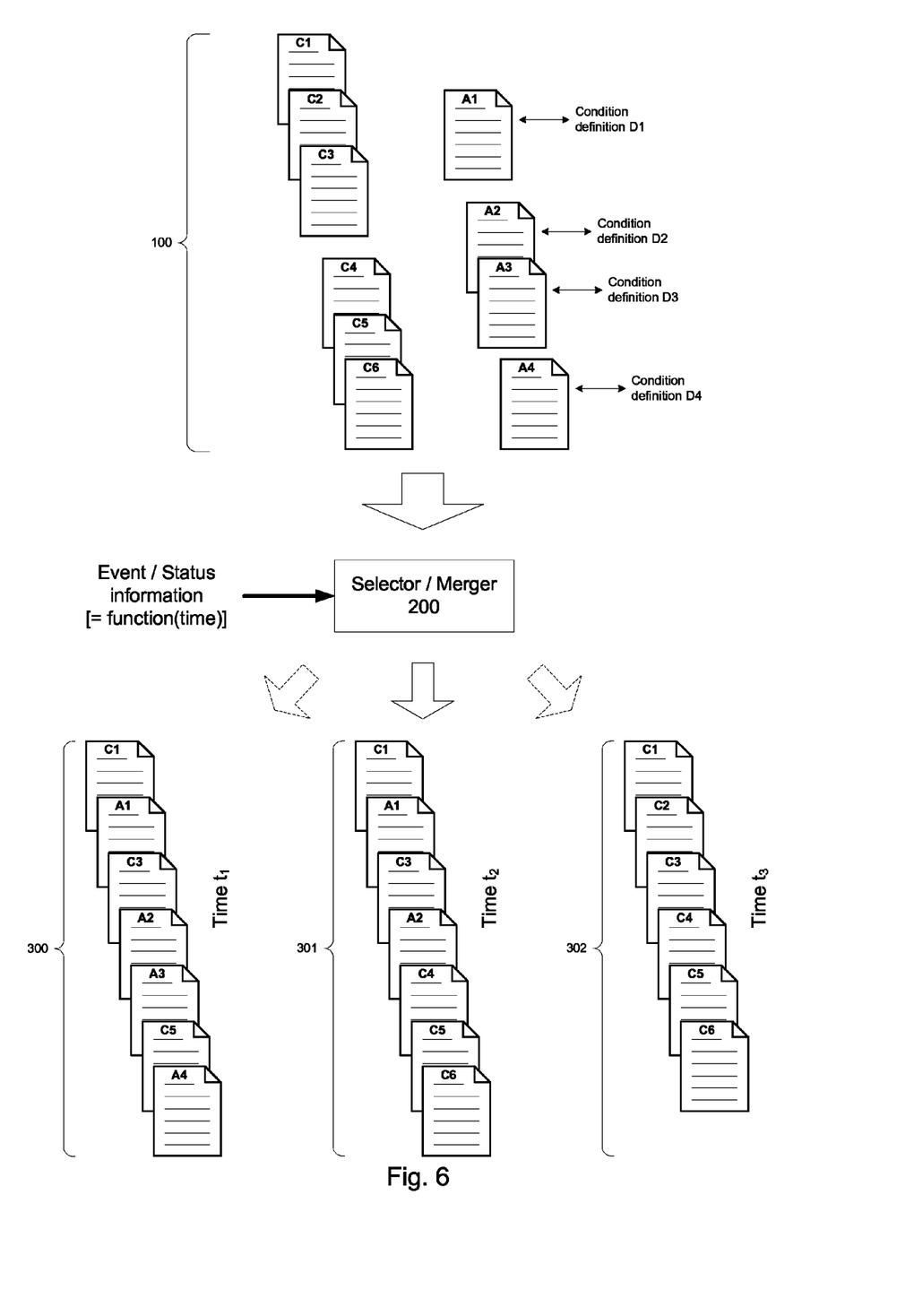
FIG. 6 schematically shows an example of a code selector for automated managing of the usage of alternative code on the basis of event and/or status information.
Figure 7:
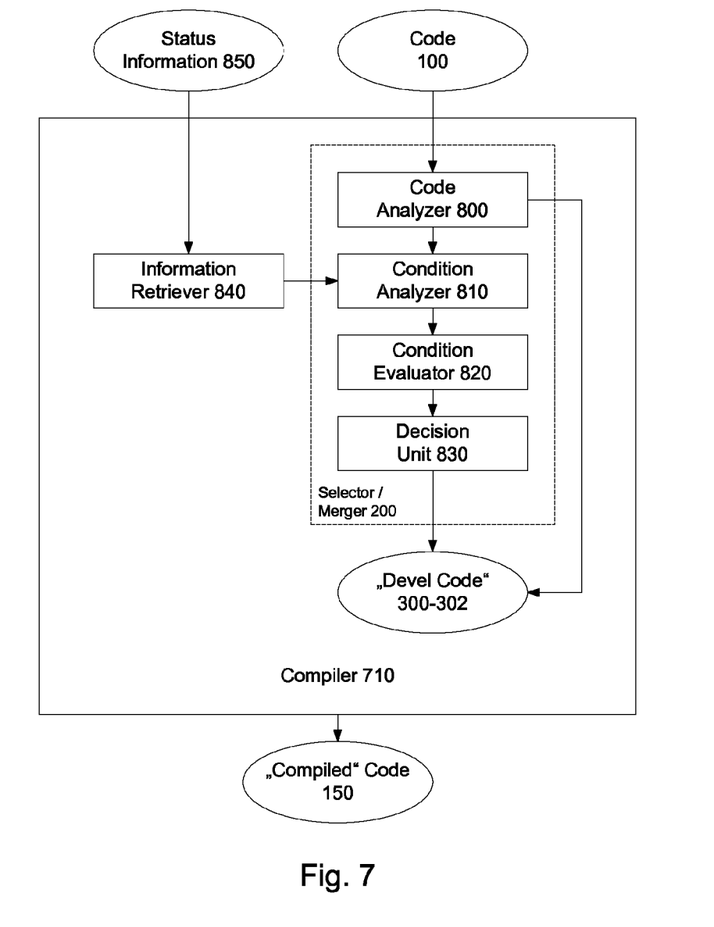
FIG. 7 schematically illustrates an exemplary block diagram of components of the selector component.

FIG. 6 further illustrates an example of the automated managing of alternative code on the basis of event and/or status information with respect to a selector component managing the composition of the development code formed of original code and conditionally activated alternative code. The selector component will be further described with reference to FIG. 7 schematically illustrating components of the selector component, which are exemplarily implemented as part of a compiler 710.

The code basis 100 from which the development code is formed comprises illustratively several sections of original code, herein code sections C1 to C6, and several alternative code sections, herein code sections A1 to A4. Each alternative code section A1 to A4 is associated with a condition definition, herein condition definitions D1 to D4. Each of the condition definitions D1 to D4 define a condition, which when met, triggers the activation and expiration of the respective alternative code sections to which it is associated.

An exemplary code basis including original code sections and an alternative code section may have following structure:

...
Original code instruction n+1
Original code instruction n+2
...
Original code instruction n+m
Alternative code block indicator: BEGIN
Alternative code condition: Timeline<Milestone X
   Alternative code instruction 1
   Alternative code instruction 2
   ...
   Alternative code instruction j
Alternative code block indicator: END
Original code instruction n+m+1
...
Original code instruction m+k The above exemplary code basis comprises two code sections and one alternative code section. The alternative code section is identifiable by a specific control code sequence. In the above example, the specific code sequence identifying the alternative code section defined a blocked code section, which is introduced by a control code indicative of the block begin and concluded by a control code indicative of the block end. Further, the control code sequence exemplarily comprises a control code specifying the condition definition, which is evaluated on the basis of the at least one of the event and status information relating to a progress of development of code basis in order to activate the alternative code section or not. Herein, the condition definition is exemplified as a condition comparing the timeline of the code basis with a project milestone, which is "Milestone X". This means that the exemplified alternative code section is activated as long as the timeline of the code basis is less than "Milestone X".

In an example of the present application, the selector 200 is provided with a code analyzer 800, which is arranged to analyze the code basis 100 supplied to the compiler 710. The code analyzer 800 is arranged to identify original code sections and alternative code sections in the code basis 100 and detect alternative code sections. Further, the selector 200 comprises a condition analyzer 810, which is arranged to receive an indication from the code analyzer 800 in case an alternative code section Ai is detected and which is arranged to retrieve the condition definition Di associated with the detected alternative code section Ai. In an example, the condition definition Di associated with a detected alternative code section Ai is part of the detected alternative code section Ai and the condition analyzer 810 is arranged to receive the detected alternative code section Ai from the code analyzer 800 and to extract the condition definition Di from the detected alternative code section Ai. An event and/or status information retriever 840 is provided in the selector 200. The information retriever 840 is arranged to receive event and/or status information 850 and/or retrieve event and/or status information 850, which is required for evaluating the condition definition Di associated with the detected alternative code section Ai. The event and/or status information relating to the progress of the development and the condition definition Di is then supplied by the information retriever 840 to a condition evaluator 820, which is arranged to evaluate the condition defined in the condition definition Di by taking into consideration the event and/or status information relating to the development progress. The result of the condition evaluator 820 is then supplied to a decision unit 830, which is arranged to conditionally activate the detected alternative code section Ai in accordance with the evaluation result of supplied by the condition evaluator 820. Hence, at different point in times, the selector 200 generates development code 300-302 being composed of original code and alternative code sections conditionally activated in accordance with the event and/or status information relating to the progress of the development.

As exemplarily illustrated, the resulting development code 300 is composed of the code sections C1, C3 and C5 and the alternative code sections A1, A2, A3, and A4 at the point in time t1; the resulting development code 301 is composed of the code sections C1, C3, C4, C5 and C6 and the alternative code sections A1 and A2 at the point in time t2; and the resulting development code 302 is composed of the code sections C1 to C6 at the point in time t3.

As understood for the illustrative diagram shown in FIG. 6, the alternative code section A1 is provided to replace the original code section C2. The alternative code section A2 is provided to amend additionally the original code between the code sections C3 and C4/A3. The alternative code sections A3 and A4 are provided to replace the respective original code sections C4 and C6.

It should be noted that the aforementioned components of the selector 200 may be arranged integrally or may be implemented as one or more separate components. The components are operatively interconnected to supply and receive the code, the information and the indications required and outputted by the components to the respective one or more other components. Moreover, one or more components may be provided by the development environment, in which the above described automated code management, is performed.

Figure 8:
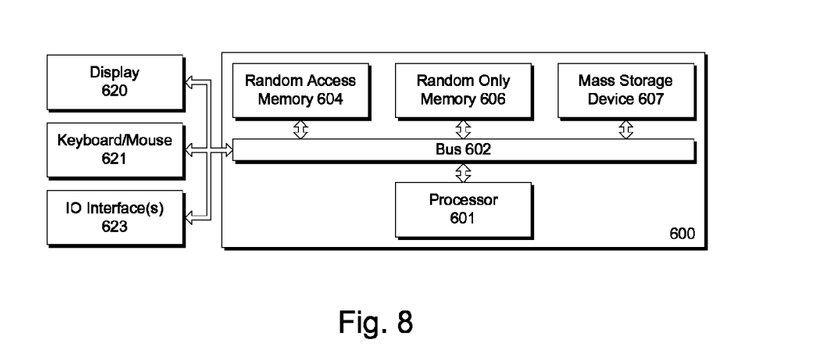
FIG. 8 illustrates a block diagram of a processing system that may be used to implement an example of the present invention.

In particular, the compiler 710 comprising the selector 200 as exemplarily described above with reference to FIG. 7 may be operated on a processing system, which is illustratively depicted in FIG. 8. FIG. 8 shows a schematic block diagram of a processing system that may be used to implement an example of the present invention. The processing system may be applicable to create a design that is described in an HDL. The computer system 600 includes a processor 602 coupled through a bus 601 to a random access memory (RAM) 604, a read only memory (ROM) 606, and a mass storage device 607. Mass storage device 607 represents a persistent data storage device, such as one or more fixed disk drive(s). The mass storage device 607 may be coupled via any data communication connection to the processing system. Processor 602 may be embodied in a general-purpose processor, an application processing device, a special purpose processor, or a specifically programmed logic device. One or more IO devices may be coupled via the bus 601 to the processing device 600. The IO devices may comprise inter alia a display device 620 coupled to the processor 602 through the bus 601 and provides graphical output for the processing system 600, a keyboard and/or cursor control unit 621 coupled to the bus 601 for communicating information and command selections to processor 602 and one or more further input/output (I/O) interfaces 623 also coupled to the processor 602 through the bus 601 and used to control and transfer data to peripheral electronic devices (printers, other computers, etc.) connected to processing system 600. It should be noted that the architecture of FIG. 8 is provided only for purposes of illustration, and that a processing system used in conjunction with the present invention is not limited to this specific architecture.

Figure 9:
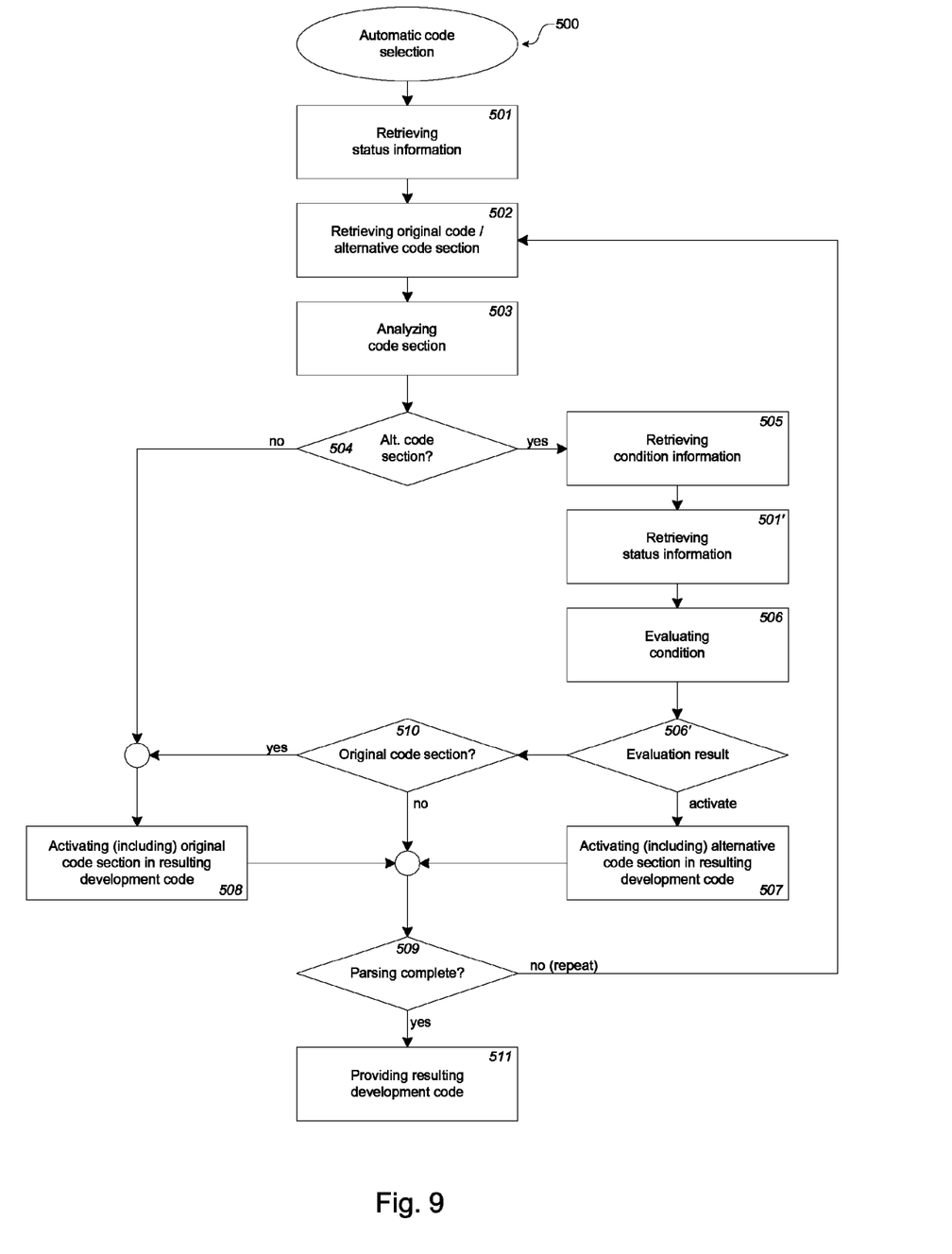
FIG. 9 schematically shows an example of flow diagram illustrating the automated managing of the usage of alternative code on the basis of event and/or status information.

FIG. 9 exemplifies the automated managing of the usage of alternative code on the basis of event and/or status information with regard to a flow diagram, see 500. The event and/or status information, which is the basis for assessing the conditions defined in the condition definitions associated with alternative code sections, is retrieved, see 501. In an example of the present application, the retrieval of the event and/or status information may be part of the retrieval of the condition definition described below with regard to the handling of alternative code sections. The retrieval of the event and/or status information should be understood as an active operation, according to which the required information is requested from components of the development environment, and/or a passive operation, according to which the information is provided and supplied via one or more interfaces interfacing to components of the development system. The code basis for the automated managing process is retrieved for instance from a code repository, a code revisioning system or a code management system and the like. The code basis may be comprised in one or more code sections, see 502. The retrieved code is then analyzed to identify original code and alternative code sections and detect alternative code sections, see 503 and 504. The retrieved code may be analyzed section-wise.

In case an alternative code section has been identified and detected, see 504, the condition definition associated with the detected alternate code section is retrieved, see 505. Additionally and/or alternatively, the event and/or status information required to allow for assessing the condition defined in the retrieved, associated condition definition is retrieved on the basis of an evaluation thereof, see 501'. The retrieved, associated condition definition is evaluated as a function of the event and/or status information, see 506. In accordance with the evaluation result, the detected alternative code section is conditionally activated, see 506' and 507. This means that in case the evaluation result indicates that the detected alternative code section is to be activated or to remain activated, the identified alternative code section may be activated in or included into the finally resulting development code formed of the original code sections and the activated alternative code sections, see 507. In an example, if the condition is met, the detected alternative code section is activated. However, the logic condition may be an inverse with regard to the above-described logic and should not be understood to limit the scope of the present application. In case the evaluation result indicates that the detected alternative code section is not to be activated, the handling of the alternative code sections is completed. In an example, it may be checked whether the detected alternative code section is a replacement section for an original code section as aforementioned with reference to FIG. 4, see 510. Accordingly, an original code section may be activated in or included into the finally resulting development code, see 510, 509 and 508, instead of an alternative code section.

In case an alternative code section has been identified, the original code section becomes part of the development code, see 508.

The analyzing and identifying of code sections is repeatedly performed until the total code provided and supplied to the code managing procedure is processed. The code managing procedure finally provides a resulting development code, which at least comprises original code and activated alternative code. The original code and activated alternative code of the resulting development code 300-302 may finally be supplied to the compiler 710, which only considers the original code section and activated alternative code sections of the resulting development code 300-302, and generates compiled code 150 thereof.

The condition definition is defined at time of creation of an alternative code section; in particular, the condition definition is mandatory requirement of and fixedly associated with an alternative code section. The condition definition may be part of the alternative code section. The condition definition should be understood as a logic relationship being a function of one or more individual event and/or status information parts as input values to one or more logic combinations with predetermined reference values. The input information is set in relation with the one or more predetermined reference values. The evaluation of the condition definition results in a yes-no decision or active/not-activate decision with respect the above wording. The condition definition may be modifiable during the development phase. In an example of the present application, the condition definition may include a default condition, which triggers the expiration of an alternative code section in case the event and/or status information relating to the development progress indicates that the development code should be the final code version to be used for tapeout. This means that the development code to be outputted by the code management procedure may only comprise original code and eventually expired alternative code sections, which are not activated. Such default definition may be used to prevent that any alternative code sections are activated such that any inacceptable situation already described above are excluded.

Those skilled in the art will understand from the above description that the automated code management of alternative code in accordance with the present application significantly reduces facilitates the manual tracking of the use of alternative code.

In examples of the present application, a method for automated code managing of the usage of alternative code is provided. The method comprises retrieving code sections including original code and alternative code from a code basis; analyzing the retrieved code to identify original code and alternative code sections in the code basis and to detect an alternative code section. The method further comprises retrieving a condition definition associated with the detected alternative code section; evaluating the condition of the retrieved condition definition; and activating the detected alternative code section in accordance with the evaluation result.

In examples of the present application, the retrieving a condition definition further comprises extracting the condition definition from the identified alternative code section.

In examples of the present application, the condition definition comprises one or more logic relationships as a function of at least one of event and status information relating to a progress of development of code basis. The method further comprises at least one of receiving and retrieving at least one of event and status information from a component of a development environment, of which the processing system is part. The condition of the retrieved condition definition is evaluated on the basis of the at least one of the event and status information.

In examples of the present application, the method further comprises providing a development code comprising the activated alternative code section.

In examples of the present application, the condition definition comprises a default condition, which prevents from activating the detected alternative code if the at least one of the event and status information indicates that a final code version is to be generated.

In examples of the present application, the code represents an abstraction code for defining the functional design of a circuit.

In examples of the present application, a processing system for automated code managing of the usage of alternative code during development is provided. The processing system is configured to perform the aforementioned method. The system comprises a code analyzer (800) arranged to retrieve code sections including original code and alternative code from a code basis provided by a data storage device of the processing system, and to analyze the retrieved code to identify original code and alternative code sections and to detect an alternative code section. The system further comprises a condition analyzer (810) arranged to retrieve a condition definition associated with the detected alternative code section; a condition evaluator (820) arranged to evaluate the condition of the retrieved condition definition; and a decision unit (830) arranged to activate the detected alternative code section in accordance with the result supplied by the condition evaluator.

In examples of the present application, the decision unit (830) is further arranged to provide a development code comprising the activated alternative code section.

In examples of the present application, the method further comprises an event and status information retriever (840) arranged to receive and/or retrieve at least one of event and status information from a component of a development environment, of which the processing system is part. The at least one of the event and status information is information relating to the progress of development of the code basis. The condition evaluator (820) arranged to evaluate the condition of the retrieved condition definition on the basis the at least one of the event and status information.

In examples of the present application, the condition definition comprises a default condition, which is met if the at least one of the event and status information indicates that a final code version is to be generated.

In examples of the present application, at least one of the code analyzer (800) and the condition analyzer (810) is further arranged to extract the condition definition from the detected alternative code section.

In examples of the present application, a non-transitory, tangible computer-readable storage medium is provided having stored thereon a computer program for automated code managing of the usage of alternative code.

It should be noted that the above description refers to the development of electronic circuits and the use of abstraction code for describing the logic and functional design and verification of the hardware under development. Those skilled in the art will understand from the above description that the automated code managing for alternative code is not limited to abstraction code for describing the logic and functional design of electronic circuits. Abstraction code may be also used to describe the functional design of analog circuits. Accordingly, the automated code managing for alternative code may be also applied during the development of the functional design of such analog circuits.

Moreover, those skilled in the art will also immediately understand that the above-described automatic management of the usage of alternative code during a development process is not limited to the development of electronic and/or analog circuits. Rather, the automatic management of the usage of alternative code also facilitates the code development of software, which may not be altered and/or modified once a final version has been generated. In particular, any software, which is embedded in hardware e.g. as firmware, or software application, which is certificated, may not be altered/modified anymore after a defined point in time. Hence, the requirements for the code quality are comparable high to those quality requirements described above with reference to the circuit development. It has to be ensured that the final version of the code may only comprise original code sections, i.e. code sections approved to be part of the final version. In particular, the examples described with reference to FIGS. 7 to 9 should be understood to refer to code development and automatic management of the usage of alternative code during a code development process. The code under development may be hardware related. This means the code under development may be code of software embedded in hardware.

In various alternate examples, the automated alternative code management may be implemented as a computer program product for use with a computerized computing system. Those skilled in the art will readily appreciate that programs defining the functions defined by the present invention can be written in any appropriate programming language and delivered to a computer in many forms, including but not limited to: (a) information permanently stored on non-writeable storage media (e.g., read-only memory devices such as ROMs or CD-ROM disks); (b) information alterably stored on writeable storage media (e.g., floppy disks and hard drives); and/or (c) information conveyed to a computer through communication media, such as a local area network, a telephone network, or a public network such as the Internet. When carrying computer readable instructions that implement the present invention methods, such computer readable media represent alternate embodiments of the present invention. As generally illustrated herein, the present invention system examples can incorporate a variety of computer readable media that comprise computer usable medium having computer readable code means embodied therein. One skilled in the art will recognize that the software associated with the various processes described herein can be embodied in a wide variety of computer accessible media from which the software is loaded and activated. The present invention anticipates and includes this type of computer readable media within the scope of the invention. The present invention scope may be understood to be limited to computer readable media wherein the media is both tangible and non-transitory.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the selector 200 may be integral part of the development environment and/or may make use of functionalities provided by the development environment.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. In particular, the order of the operations described with reference to FIG. 9 may be altered without changing the overall operation of the automated code managing procedure.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense. In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed:

1. A method for automated code managing of the usage of alternative code, said method comprising:
   retrieving code sections including original code and alternative code from a code basis, wherein the original code to represent a first abstraction code to define a first functional design of a target circuit, wherein the alternative code is provided as an alternative solution for a problem identified during a verification/simulation run, to provide functionality, which has not been coded at a current development stage;
   analyzing the retrieved code to identify original code and alternative code sections in the code basis and to detect an alternative code section;
   retrieving a condition definition associated with the detected alternative code section;
   evaluating the condition of the retrieved condition definition; and
   activating the detected alternative code section in accordance with the evaluation result.

2. The method according to claim 1, wherein said retrieving a condition definition comprises:
   extracting the condition definition from the identified alternative code section.

3. The method according to claim 1, wherein the condition definition comprises one or more logic relationships as a function of at least one of event and status information relating to a progress of development of code basis, wherein the method further comprises
   at least one of receiving and retrieving at least one of event and status information from a component of a development environment, of which the processing system is part,
   wherein said condition of the retrieved condition definition is evaluated on the basis of the at least one of the event and status information.

4. The method according to claim 1, said method further comprising:
   providing a development code comprising the activated alternative code section.

5. The method according to claim 1, wherein the condition definition comprises a default condition, which prevents from activating the detected alternative code if the at least one of the event and status information indicates that a final code version is to be generated.

6. The method of claim 1, wherein the alternative code to represent a second abstraction code to define a second functional design of the target circuit.

7. The method of claim 1, wherein the alternative code and the original code define a development status of the code basis at a given point in time.

8. A processing system for automated code managing of the usage of alternative code during development, said system comprising:
   a processor configured to execute:
      a code analyzer arranged to retrieve code sections including original code and alternative code from a code basis provided by a data storage device of the processing system, and to analyze the retrieved code to identify original code and alternative code sections and to detect an alternative code section, wherein the original code to represent a first abstraction code to define a first functional design of a target circuit, wherein the alternative code is provided as an alternative solution for a problem identified during a verification/simulation run, to provide functionality, which has not been coded at a current development stage;
      a condition analyzer arranged to retrieve a condition definition associated with the detected alternative code section;
      a condition evaluator arranged to evaluate the condition of the retrieved condition definition; and
      a decision unit arranged to activate the detected alternative code section in accordance with the result supplied by the condition evaluator.

9. The processing system according to claim 8, wherein the decision unit is further arranged to provide a development code comprising the activated alternative code section.

10. The processing system according to claim 8, said method further comprising:
    an event and status information retriever arranged to receive and/or retrieve at least one of event and status information from a component of a development environment, of which the processing system is part, wherein the at least one of the event and status information is information relating to the progress of development of the code basis, wherein the a condition evaluator arranged to evaluate the condition of the retrieved condition definition on the basis the at least one of the event and status information.

11. The processing system according to claim 8, wherein the condition definition comprises a default condition, which is met if the at least one of the event and status information indicates that a final code version is to be generated.

12. The processing system according to claim 8, wherein at least one of the code analyzer and the condition analyzer is further arranged to extract the condition definition from the detected alternative code section.

13. The processing system of claim 8, wherein the alternative code to represent a second abstraction code to define a second functional design of the target circuit.

14. The processing system of claim 8, wherein the alternative code and the original code define a development status of the code basis at a given point in time.

15. Non-transitory, tangible computer-readable storage medium having stored thereon a computer program for automated code managing of the usage of alternative code, the computer program comprising a set of instructions, which, when executed on a processing system, cause the processing system to perform the method comprising:
    retrieving code sections including original code and alternative code from a code basis, wherein the original code to represent a first abstraction code to define a first functional design of a target circuit, wherein the alternative code is provided as an alternative solution for a problem identified during a verification/simulation run, to provide functionality, which has not been coded at a current development stage;
    analyzing the retrieved code to identify original code and alternative code sections in the code basis and to detect an alternative code section;
    retrieving a condition definition associated with the detected alternative code section;

evaluating the condition of the retrieved condition definition; and activating the detected alternative code section in accordance with the evaluation result.

16. The non-transitory tangible computer-readable storage medium of claim 15, wherein said retrieving a condition definition comprises:

extracting the condition definition from the identified alternative code section.

17. The non-transitory tangible computer-readable storage medium of claim 15, wherein the condition definition comprises one or more logic relationships as a function of at least one of event and status information relating to a progress of development of code basis, wherein the method further comprises at least one of receiving and retrieving at least one of event and status information from a component of a development environment, of which the processing system is part, wherein said condition of the retrieved condition definition is evaluated on the basis of the at least one of the event and status information.

18. The non-transitory tangible computer-readable storage medium of claim 15, said method further comprising:

providing a development code comprising the activated alternative code section.

19. The non-transitory tangible computer-readable storage medium of claim 15, wherein the condition definition comprises a default condition, which prevents from activating the detected alternative code if the at least one of the event and status information indicates that a final code version is to be generated.

20. The non-transitory tangible computer-readable storage medium of claim 15, wherein the alternative code to represent a second abstraction code to define a second functional design of the target circuit.

* * * * *